(12) United States Patent
Kim et al.

(10) Patent No.: US 8,354,219 B2
(45) Date of Patent: Jan. 15, 2013

(54) PHOTOSENSITIVE RESIN COMPOSITION AND DRY FILM COMPRISING THE SAME

(75) Inventors: Hee-Jung Kim, Daejeon (KR); You-Jin Kyung, Daejeon (KR); Kwang-Joo Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/191,027

(22) Filed: Jul. 26, 2011

(65) Prior Publication Data
US 2011/0278049 A1    Nov. 17, 2011

Related U.S. Application Data

(63) Continuation of application No. PCT/KR2010/007099, filed on Oct. 15, 2010.

(30) Foreign Application Priority Data

Oct. 15, 2009  (KR) .................. 10-2009-0098282
May 12, 2010  (KR) .................. 10-2010-0044302

(51) Int. Cl.
*G03F 7/038* (2006.01)

(52) U.S. Cl. ............. 430/283.1; 174/254; 174/256; 430/280.1; 430/281.1; 528/310

(58) Field of Classification Search ............. 174/254, 174/256; 430/280.1, 281.1, 283.1; 528/310
See application file for complete search history.

(56) References Cited

U.S. PATENT DOCUMENTS

| | | | | |
|---|---|---|---|---|
| 6,010,825 A | * | 1/2000 | Hagen et al. | ............ 430/283.1 |
| 7,019,104 B1 | | 3/2006 | Okada et al. | |

FOREIGN PATENT DOCUMENTS

| | | |
|---|---|---|
| JP | 2004-285129 A | 10/2004 |
| KR | 2002-0042733 A | 6/2002 |
| KR | 10-2005-0081824 A | 8/2005 |
| KR | 10-2008-0002907 A | 1/2008 |
| KR | 10-2009-0054509 A | 6/2009 |

* cited by examiner

*Primary Examiner* — Gregory Listvoyb
(74) *Attorney, Agent, or Firm* — Rothwell, Figg, Ernst & Manbeck, P.C.

(57) ABSTRACT

The present invention relates to a photosensitive resin composition which is developable with an alkaline aqueous solution and does not need a high temperature for curing and the like, and has all the properties suitable for use in a cover film of a printed circuit board or a laminated body for a semiconductor, and a dry film comprising the same. The photosensitive resin composition comprises (A) a polyamic acid comprising a polymer of at least one diamine compound and at least one acid dianhydride; (B) a photopolymerizable compound having at least one polymerizable ethylenic unsaturated bond in its molecule; and (C) a photoinitiator.

23 Claims, No Drawings

PHOTOSENSITIVE RESIN COMPOSITION AND DRY FILM COMPRISING THE SAME

CROSS REFERENCE TO RELATED APPLICATIONS

The present application is a continuation of International Application No. PCT/KR2010/007099, with an International Filing Date of Oct. 15, 2010, which claims the benefit of Korean Patent Application No. 10-2009-0098282 filed in the Korea Intellectual Property Office on Oct. 15, 2009, and of Korean Patent Application No. 10-2010-0044302 filed in the Korea Intellectual Property Office on May 12, 2010, which are incorporated herein by reference.

TECHNICAL FIELD

The present invention relates to a photosensitive resin composition and a dry film comprising the same. More specifically, the present invention relates to a photosensitive resin composition which is capable of being developed with an alkaline aqueous solution, does not need a high temperature for curing and the like, and possesses all the properties suitable for use in a cover film of a printed circuit board or a laminated body for a semiconductor, and a dry film comprising the same.

BACKGROUND OF ART

Polyimide and a precursor thereof are used as a base film of a printed circuit board, a cover film for a large scale integrated semiconductor device or a printed circuit board, or the like since they have an excellent durability, a heat resistance, a flame retardant property, and mechanical and electrical properties.

For example, in a flexible circuit board, a polyimide film is utilized as a base film that is used together with copper (Cu) of a Copper Clad Laminate (hereinafter, CCL) with a conductive circuit pattern formed thereon. It is also utilized as a coverlay film (i.e., a cover film) for protecting the conductive circuit pattern and for enhancing a bending resistance. Such a coverlay film is processed in advance through punching before it is laminated on the surface of the CCL with a circuit formed thereon by using a thermal compression method. However, as the electronic devices are getting smaller and required to have multiple functions, a printed circuit board to be used therein becomes highly densified and the circuits become fine. Since the coverlay film is punched beforehand and then is aligned and layered with a circuit on the CCL by an operator, a precision alignment is a daunting task and indeed imposes limitations in meeting the demands for a fine circuit or a highly densified printed circuit board.

There were recent attempts to resolve these problems by adopting a photolithography process using a photosensitive resin composition. In this attempt, the photosensitive resin composition was thermally compressed on a circuit of the CCL, exposed to light according to a pattern, and then developed to give a patterned structure, by which a fine hole can be punched more precisely and thus it is possible to meet the demands for a fine circuit and the like.

In this regard, the majority of photosensitive resin compositions known to be available for such uses need to use a flammable organic solvent or a toxic solvent as a developing solution, but such solvents may cause problems in a working stability or the environment. Therefore, recently, a photosensitive resin composition developable with an alkaline aqueous solution continues to be demanded.

Also, in order for the photosensitive resin composition to be used in forming the coverlay film as described above and thus to effectively protect the circuit, a dry film made therefrom or its cured product needs to satisfy requirements for a variety of desired properties such as a solder heat resistance, a folding endurance (brittleness and a bending resistance), a chemical resistance, an electrically insulating property, a flame retardant property, and the like.

However, no photosensitive resin composition previously known in the art can be developed with an alkaline aqueous solution while satisfying the requirements for all the foregoing properties.

In a bid to deal with these problems, there was an attempt to develop a photosensitive resin composition based on polyimide. This is because the polyimide was used for protection of the circuit while satisfying a heat resistance, a bending resistance, or a insulating property. Despite such an attempt, however, a polyimide based photosensitive resin composition has following drawbacks when being used in forming a circuit protection film such as the coverlay film.

Because a photosensitive resin composition comprising polyimide itself is disadvantageous in forming a film, such photosensitive resin composition needs to comprise a precursor of polyimide, for example a polyamic acid. In this case, after a pattern is formed by using the photosensitive resin composition, the polyamic acid is subjected to a polyimidization to produce a coverlay film, and a high temperature of about 350° C. is required for the polyamic acid previously known in the art to become the polyimide. This is undesirable because polyimidazation through a hot thermal curing can cause oxidization and deterioration of a copper circuit that is vulnerable to heat. Moreover, a photosensitive circuit protection film such as the coverlay film should be able to fill a space between fine patterns of the circuit, but the polyimide has difficulty in realizing such a filling function. Also, since these type of photosensitive resin compositions based on polyimide have difficulties in a developing process with an alkaline aqueous solution, they are still disadvantageous in light of a working stability or the environment.

DESCRIPTION OF THE INVENTION

Technical Objectives

The present invention is to provide a photosensitive resin composition which is developable with an alkaline aqueous solution, does not need a high temperature for curing and the like, and possesses all the properties suitable for use in a cover film of a printed circuit board or a laminated body for a semiconductor.

Further, the present invention is to provide a dry film comprising the photosensitive resin composition as above and a method of forming a pattern using the same.

Further, the present invention is to provide a print circuit board, a flexible circuit board or a laminated body for a semiconductor obtained from the dry film.

Technical Solution

The present invention provides a photosensitive resin composition which comprises (A) a polyamic acid comprising a polymer of at least one diamine compound comprising a compound of Chemical Formula (1) as follows and at least one acid dianhydride; (B) a photopolymerizable compound having at least one polymerizable ethylenic unsaturated bond in its molecule; and (C) a photoinitiator:

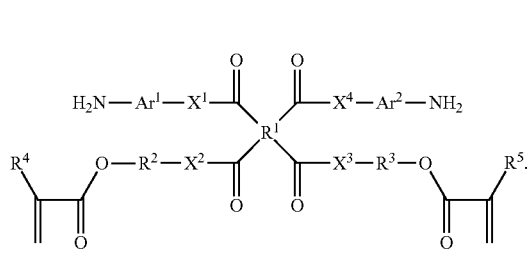

(1)

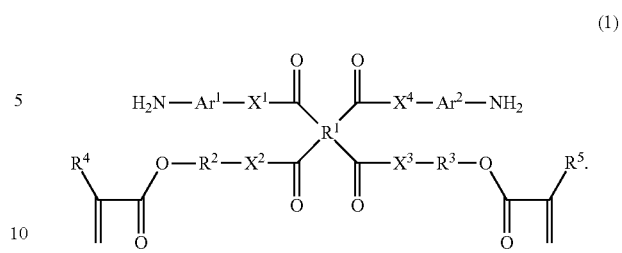

(1)

In Chemical Formula (1), each of $X^1$ to $X^4$ is independently —O— or NR', in which each R' is independently hydrogen or an alkyl group of C1 to C3; $R^1$ is a tetravalent cycloaliphatic hydrocarbon group of C5 to C18 or a tetravalent aromatic hydrocarbon group of C6 to C18; each of $R^2$ and $R^3$ is independently an alkylene group of C1 to C6; each of $R^4$ and $R^5$ is independently hydrogen or an alkyl group of C1 to C6; and each of $Ar^1$ and $Ar^2$ is independently an arylene group of C6 to C18.

In the compound of Chemical Formula (1), each of $X^1$ to $X^4$ can be —O—; $R^1$ can be a tetravalent aromatic hydrocarbon group of C6 to C10; each of $R^2$ and $R^3$ can be independently an alkylene group of C1 to C3; each of $R^4$ and $R^5$ can be independently hydrogen or an alkyl group of C1 to C3; and each of $Ar^1$ and $Ar^2$ can be independently an arylene group of C6 to C10. Preferably, the compound of Chemical Formula (1) can be the compound of Chemical Formula (2) as follows, which can be abbreviated by HEMA-DB:

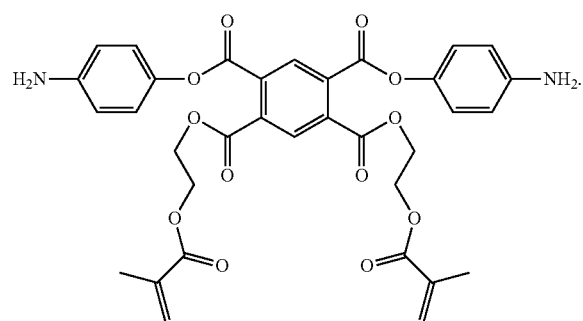

(2)

Also, the present invention provides a dry film comprising the photosensitive resin composition as above.

The present invention further provides a method of forming a pattern which comprises the steps of exposing the dry film to light; and developing the dry film with an alkaline aqueous solution.

The present invention further provides a printed circuit board, a flexible circuit board, and a laminated body for a semiconductor comprising a cured product of the dry film.

Hereinafter, the photosensitive resin composition and the dry film in accordance with specific embodiments of the present invention will be explained.

[Photosensitive Resin Composition]

An embodiment of the present invention provides a photosensitive resin composition which comprises (A) a polyamic acid comprising a polymer of at least one diamine compound comprising a compound of Chemical Formula (1) as follows and at least one acid dianhydride; (B) a photopolymerizable compound having at least one polymerizable ethylenic unsaturated bond in its molecule; and (C) a photoinitiator:

In Chemical Formula (1), each of $X^1$ to $X^4$ is independently —O— or NR', wherein R' is independently hydrogen or an alkyl group of C1 to C3; $R^1$ is a tetravalent cycloaliphatic hydrocarbon group of C5 to C18 or a tetravalent aromatic hydrocarbon group of C6 to C18; each of $R^2$ and $R^3$ is independently an alkylene group of C1 to C6; each of $R^4$ and $R^5$ is independently hydrogen or an alkyl group of C1 to C6; each of $Ar^1$ and $Ar^2$ is independently an arylene group of C6 to C18.

The photosensitive resin composition comprises a photopolymerizable compound and a photoinitiator together with a polyamic acid that is a precursor of polyimide. The polyamic acid is a polymer (i.e., condensation polymer) of a specific diamine compound (i.e., the compound of Chemical Formula (1)) and an acid dianhydride. The experiments carried out by the present inventors shows that the photosensitive resin composition comprising such, polyamic acids makes it possible to form a desired pattern by coating it on a substrate, exposing it to light, and then developing it with an alkaline aqueous solution. Therefore, the photosensitive resin composition of the present invention can resolve problems of the prior arts regarding a work stability or the environment.

Also, imidization (i.e., a curing) of the polyamic acid can proceed at a relatively low temperature of about 150 to 230° C. to produce a polyimide film. Therefore, the photosensitive resin composition of the present invention can greatly ease concerns about oxidation or deterioration of the circuit and can be preferably utilized as a use for a cover film (a coverlay film) of a printed circuit board, a circuit protection film of a flexible circuit board, or interlayer dielectrics of a laminated body for a semiconductor.

Also, as substantiated by the following examples, when the photosensitive resin composition of the present invention being coated, patterned, and then cured to form a film, it was found that such film shows an excellent property of filling a space in a circuit (i.e., a filling property after lamination, hereinafter, referred to as a "post-lamination filling property"), a heat resistance, a bending resistance, an insulating property, a chemical resistance, and the like. Therefore, it can be preferably utilized as a use for forming a cover film of a printed circuit board (i.e., a coverlay film) or a circuit protection film of a flexible circuit board.

It is believed that the aforementioned excellent properties are related to existence of a photopolymerizable vinyl moiety in the polyamic acid or the type of the substituent group bonded thereto. In order words, it is believed that such vinyl moiety allows the polyamic acid to make a covalent bond with other monomers (e.g., a photopolymerizable compound) added in the composition and thus to form a robust interpenetrating polymer network (IPN) of the chemical bonds between the monomers and the polyamic acid (or the polyimide). Therefore, the cured product or the film obtained from the photosensitive resin composition of the present invention is believed to be able to show uniformly improved properties.

In this regard, Korean Patent Laid-open Publication No. 2002-0042733 discloses certain diamines and acid dianhydrides, together with a polyamic acid and polyimide obtained therefrom. However, the disclosure only mentions a photosensitive resin composition comprising the polyimide but fails to mention or suggest a composition comprising the precursor thereof, i.e., the polyamic acid. And the disclosure fails to hint that a photosensitive resin composition comprising the polyamic acid can be preferably used as a cover film of a printed circuit board.

In addition, the diamine compound and the polyamic acid as disclosed in this patent publication have a cinnamate structure wherein a substituted or unsubstituted phenyl is bonded to a position corresponding to $R^4$ and $R^5$ of Chemical Formula (1) so that a photo-induced crosslinkings occur without a initiator. Therefore, it differs in terms of a structure and characterization from the polyamic acid contained in the composition according to an embodiment of the present invention, wherein hydrogen or an alkyl group of C1 to C3 is bonded and makes an interaction with a photoinitiator. Further, due to such differences, the polyamic acids of the publication show different properties from that of an embodiment of the present invention, and they are expected to have difficulties in being utilized as a use for the photosensitive resin composition in accordance with an embodiment of the present invention or for forming a cover film of a printed circuit board.

Hereinafter, the photosensitive resin composition in accordance with an embodiment of the present invention will be explained in detail for each component thereof.

Polyamic Acid

The polyamic acid, which is used for a precursor of polyimide in the photosensitive resin composition of the present invention, is a polymer (e.g., a condensation polymer) of at least one diamine compound essentially comprising a compound of Chemical Formula (1) and at least one acid dianhydride compound.

In particular, among the compounds of Chemical Formula (1), one can preferably use the one wherein each of $X^1$ to $X^4$ is —O—; $R^1$ is a tetravalent aromatic hydrocarbon group of C6 to C10; each of $R^2$ and $R^3$ is independently an alkylene group of C1 to C3; each of $R^4$ and $R^5$ is independently hydrogen or an alkyl group of C1 to C3; and each of $Ar^1$ and $Ar^2$ is independently an arylene group of C6 to C10, and more preferably use the compound of Chemical Formula (2) as follows (HEMA-DB):

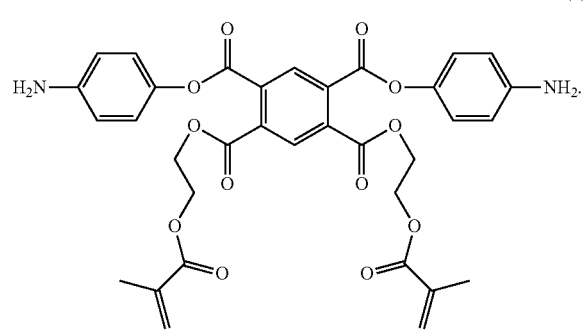

(2)

Besides the compound of Chemical Formula (1), various diamine compounds can be used together and examples thereof include at least one compound selected from the group consisting of p-phenylenediamine (p-PDA), m-phenylenediamine (m-PDA), 4,4'-oxydianiline (4,4'-ODA), 3,4'-oxydianiline (3,4'-ODA), 2,2-bis(4-[4-aminophenoxy]-phenyl)propane (BAPP), 1,3-bis(4-aminophenoxy)benzene (TPER), 1,4-bis(4-aminophenoxy)benzene (TPE-Q), and 2,2-bis(4-[3-aminophenoxy]phenyl)sulfone (m-BAPS).

Also, in order to control a modulus of a film obtained from the photosensitive resin composition of the present invention, one can use a silicon diamine compound of Chemical Formula (3) other than the diamine compounds as mentioned above:

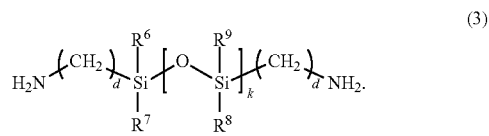

(3)

In Chemical Formula (3), each of $R^6$ to $R^9$ is independently an aliphatic hydrocarbon group of C1 to C12, a phenyl group, or a methoxy group, d is an integer of 1 to 5, and k is an integer of 1 to 20.

For the acid dianhydride reacting with the diamine compound as described above, any acid dianhydride avialable for forming a polyamic acid can be used without limitation. Examples of the acid dianhydride includes at least one compound selected from the group consisting of pyromellitic dianhydride, 3,3'-4,4'-biphenyltetracarboxylic dianhydride (BPDA), 3,3',4,4'-benzophenone tetracarboxylic dianhydride, 4,4'-oxydiphthalic anhydride (ODPA), 4,4'-(4,4'-isopropylbiphenoxy)biphthalic anhydride, 2,2'-bis-(3,4-dicarboxylphenyl)hexafluoropropane dianhydride, and ethylene glycol bisanhydrotrimellitate (TMEG).

The polyamic acid of the present invention can be prepared by a well known method in the art. By way of example, the polyamic acid can be prepared by dissolving the diamine compound such as the compound of Chemical Formula (1) in a solvent, adding the resulting solution with the acid dianhydride compound, and then reacting together (for example carrying out a condensation polymerization). It is preferable that the reaction between the diamine compound and the acid dianhydride starts at a temperature of 0 to 15° C. and proceeds with a reaction temperature at a range of 10 to 40° C. until it is completed typically for around 24 hours. It is also preferable that in this reaction, a mole ratio between the diamine compound and the acid dianhydride range 1:0.9 to 1:1.1 to obtain the polyamic acid. If the mole ratio of the diamine compound and the acid dianhydride is below 1:0.9, the molecular weight of the polyamic acid decreases so much that it may be difficult to obtain polyimide with excellent mechanical properties. On the contrary, if the mole ratio of the diamine compound and the acid dianhydride is above 1:1.1, the viscosity of the photosensitive resin composition becomes so high that many processes necessary for coating and other operations will be rendered difficult.

The weight average molecular weight of the polyamic acid is preferably from 5,000 to 300,000 and more preferably from 8,000 to 200,000. If the weight average molecular weight of the polyamic acid is below 5,000, the viscosity of the photosensitive resin composition or the molecular weight of the polyamic acid decreases so much that the properties of the polyimide obtained therefrom can deteriorate. Also, if the weight average molecular weight of the polyamic acid is above 300,000, the photosensitive resin composition becomes highly viscous and thus the handling thereof may be difficult.

As a solvent for use in the preparation of the polyamic acid, one can use at least one selected from the group consisting of N-methyl pyrrolidinone (NMP), N,N-dimethyl acetamide (DMAc), tetrahydrofurane (THF), N,N-dimethyl formamide (DMF), dimethylsulfoxide (DMSO), cyclohexane, acetonitrile and a mixture thereof.

Photopolymerizable Compounds

The photopolymerizable compound contained in the photosensitive resin composition according to an embodiment of the present invention has at least one polymerizable ethylenic unsaturated bond in its molecule. As the photopolymerizable compound, one can use a (meth)acrylate compound having at least one C—C double bond or a mixture of two or more such (meth)acrylate compounds.

For example, as the photopolymerizable compound, one can use a (meth)acrylate compound either having two photopolymerizable double bonds or having both at least one double bond and at least one hydroxyl or epoxy group. More specifically, one can use a monofunctional acrylate or a multifunctional acrylate, and for obtaining compatibility and good properties after a film formation, one can use an acrylate compound containing at least one of various functional groups such as hydroxyl group, epoxy group, or the like. Also, in order for the finally cured product to have good properties and to maintain an adhesion to a copper clad, an epoxy modified acrylate can be used.

Two or more (meth)acrylate compounds each including at least one carbon-carbon double bond show an excellent compatibility with the polyamic acid. Also, containing two or more (meth)acrylate compounds makes it possible to realize a photosensitive resin composition with a good developing ability to an alkaline aqueous solution and an excellent photosensitivity. In addition, if the photosensitive resin composition is processed into a dry film, it has a lower modulus when being subjected to a thermal treatment and has a fluidity when being subjected to a thermal lamination process to improve a post-lamination filling property for an uneven circuit pattern. Therefore, it is possible to carry out the thermal lamination process at a relatively low temperature. A dry film obtained from the photosensitive resin composition including a (meth)acrylate compound with an epoxy group shows an enhanced adhesion property with the copper clad and an improved resistance to hydrolysis.

As the (meth)acrylate with two photopolymerizable carbon-carbon double bonds, preferable is an EO or PO modified (meth)acrylate compound, examples of which includes A-BPE-10, A-BPE-20, A-BPE-30, BPE-500, and BPE-900 manufactured by NK Ester, a bisphenol A EO modified (meth)acrylate, a bisphenol F EO modified (meth)acrylate, and a PO modified (meth)acrylate manufactured by Shin-Nakamura chemical, Co., Ltd., or Kongyoungsa, Inc., SR-480, SR-602, and CD-542 manufactured by Stomer, Co., Ltd. and the like.

Also, as the (meth)acrylate compound with two photopolymerizable carbon-carbon double bonds, one can use triethylene glycol diacrylate, neopentyl glycol diacrylate, 1,6-hexanediol diacrylate, 3-methyl-1,5-pentanediol diacrylate, 2-butyl-2-ethyl-1,3-propanediol diacrylate, 1,9-nonanediol diacrylate, polyethyleneglycol diacrylate, PEG#200 diacrylate, PEG#400 diacrylate or PEG#600 diacrylate manufactured by Kongyoungsa, Inc., or the like.

As the (meth)acrylate compound with at least one photopolymerizable carbon-carbon double bond and a hydroxyl group, one can use 2-hydroxyethyl methacrylate (HEMA), 2-hydroxypropyl methacrylate, 2-hydroxy acrylate, 2-hydroxypropyl acrylate, 2-hydroxybutyl methacrylate, phenyl glycidyl ester acrylate (Nipponkayaku, Co., Ltd., R-128H), 1,6-hexanediol epoxy acrylate (Nipponkayaku, Co., Ltd., Kayarad R-167), Ebecryl 9695 or the like.

As the (meth)acrylate compound with at least one photopolymerizable carbon-carbon double bond and an epoxy group, one can use a glycidyl compound such as glycidyl (meth)acrylate, NK oligomer EA 1010 and EA-6310 manufactured by Shin-Nakamura chemical, Co., Ltd., or the like.

Among the (meth)acrylate compounds with two polymerizable carbon-carbon double bond, an epoxy(meth)acrylate including at least two or more hydroxyl groups is advantageous as it improves resistance to hydrolysis and adhesion to the copper clad for the finally cured product and at the same time it enhances the solubility to the alkaline aqueous solution to shorten a developing time.

Among the (meth)acrylate compounds with two polymerizable carbon-carbon double bond, examples of the epoxy (meth)acrylate including at least two or more hydroxyl groups includes, but are not limited to, NK oligomer, EA-1020, EA-6320, EA-6340, Ebecryl 600, and ZAA-205 and ZFA-266H from Nipponkayaku, Co., Ltd.

The photopolymerizable compound can be contained in the amount of 30 to 200 parts by weight with respect to 100 parts by weight of the polyamic acid contained in the photosensitive resin composition according to the present invention. If the content of the photopolymerizable compound is less than 30 parts by weight, a developing property and the post-lamination filling property may deteriorate. If it exceeds 200 parts by weight, the heat resistance may be worsened or the mechanical properties of the film including the folding endurance may be deteriorate.

Photoinitiator

The photosensitive resin composition as described above includes a photoinitiator. The photoinitiator can be included in the amount of 0.3 to 10 parts by weight with respect to 100 parts by weight of the polyamic acid included in the photosensitive resin composition. If the content of the photoinitiator is below 0.3 parts by weight, the photoinitiator shows a lower degree of participation in the photo-curing. If the content of the photoinitiator is above 10 parts by weight, the properties of the film obtained from the photosensitive resin composition can deteriorate due to remaining radicals that have not participated in the curing reaction.

For the photoinitiator, one can use an acetophenon compound such as 2-hydroxy-2-methyl-1-phenylpropane-1-on, 1-(4-isopropylphenyl)-2-hydroxy-2-methylpropane-1-on, 4-(2-hydroxyethoxy)-phenyl-(2-hydroxy-2-propyl)ketone, 1-hydroxy-cyclohexyl phenyl ketone, benzoin methyl ether, benzoin ethyl ether, benzoin isobutyl ether, benzoin butyl ether, 2,2-dimethoxy-2-phenylacetophenone, 2-methyl-(4-methylthio)phenyl-2-morpholino-1-propane-1-on, 2-benzyl-2-dimethylamino-1-(4-morpholinophenyl)-butane-1-on, 2-methyl-1-[4-(methylthio)phenyl]-2-morpholinopropane-1-on or the like; a biimidazole compound such as 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1, 2'-biimidazole, 2,2'-bis(2,3-dichlorophenyl)-4,4',5,5'-tetraphenyl biimidazole, 2,2'-bis(o-chlorophenyl)-4,4',5,5'-tetraphenyl-1,2'-biimidazole or the like; a triazine compound such as 3-{4-[2,4-bis(trichloromethyl)-s-triazine-6-yl] phenylthio}propionic acid, 1,1,1,3,3,3-hexafluoroisopropyl-3-{4[2,4-bis(trichloromethyl)-s-triazine-6-yl] phenylthio}propionate, ethyl-2-{4-[2,4-bis (trichloromethyl)-s-triazine-6-yl]phenylthio}acetate, 2-epoxyethyl-2-{4-[2,4-bis(trichloromethyl)-s-triazine-6-yl]phenylthio}acetate, cyclohexyl-2-{4-[2,4-bis(trichloromethyl)-s-triazine-6-yl]phenylthio}acetate, benzyl-2-{4-[2,4-bis(trichloromethyl)-s-triazine-6-yl]phenylthio}acetate, 3-{chloro-4-[2,4-bis(trichloromethyl)-s-triazine-6-yl]phenylthio}propionic acid, 3-{4-[-2,4-bis(trichloromethyl)-s-triazine-6-yl]phenylthio}propionamide, 2,4-bis(trichloromethyl)-6-p-methoxystyryl-s-triazine, 2,4-bis(trichloromethyl)-6-(1-p-dimethylaminophenyl)-1,3,-butadienyl-s-triazine, 2-trichloromethyl-4-amino-6-p-methoxystyryl-s-triazine or the like; and an oxime compound such as CGI-242 and CGI-124 manufactured by Chiba, Co., Ltd. in Japan; or a phosphine oxide compound such as bis(2,4,6-trimethyl-benzoyl)phenyl phosphine oxide, bis(2,6-dimethoxy-benzoyl)-2,4,4-trimethyl-pentyl-phosphine oxide and the like. Besides, one can use any photoinitiator known to be available for a photosensitive resin composition without any limitation. Examples of the commercially available photoinitiator include Irgacure™651, Irgacure™819, Irgacure™369 and the like.

Other than aforementioned three components, the photosensitive resin composition in accordance with an embodiment of the present invention can further includes a solvent and it can further includes additives such as a photocrosslinking sensitizer, a curing accelerator, a flame retardant, an antifoaming agent, a levelling agent, an anti-gelling agent and the like. Additional components such as the solvent or the additives will be explained in detail as follows.

Photocrosslinking Sensitizers/Curing Accelerators

The photosensitive resin composition of the present invention may include a photocrosslinking sensitizer promoting the radical generation and/or a curing accelerator promoting the curing as an auxiliary component. These components can be included in the amount of 0.01 to 10 parts by weight with respect to 100 parts by weight of the polyamic acid as described above, respectively. Preferably, they may be included in the amount of 0.1 to 5 parts by weight with respect to 100 parts by weight of the polyamic acid, respectively. If the content thereof is out of the above range, sensitizing effect for photocrosslinking cannot be properly obtained or these components may have a negative effect on the developing property.

As the photocrosslinking sensitizer, one can use a benzophenone compound such as benzophenone, 4,4-bis(dimethylamino)benzophenone, 4,4-bis(diethylamino)benzophenone, 2,4,6-trimethylaminobenzophenone, methyl-o-benzoylbenzoate, 3,3-dimethyl-4-methoxybenzophenone, 3,3,4,4-tetra(t-butylperoxy-carbonyl)benzophenone or the like; a fluorenone compound such as 9-fluorenone, 2-chloro-9-fluorenone, 2-methyl-9-fluorenone or the like; a thioxanthone compound such as thioxanthone, 2,4-diethyl-thioxanthone, 2-chloro-thioxanthone, 1-chloro-4-propyloxy-thioxanthone, isopropyl thioxanthone, diisopropyl thioxanthone or the like; a xanthone compound such as xanthone, 2-methylxanthone or the like; an anthraquinone compound such as anthraquinone, 2-methyl-anthraquinone, 2-ethyl anthraquinone, t-butyl anthraquinone, 2,6-dichloro-9,10-anthraquinone or the like; an acridine compound such as 9-phenylacridine, 1,7-bis(9-acrydinyl)heptane, 1,5-bis(9-acrydinylpentane), 1,3-bis(9-acrydinyl)propane or the like; a dicarbonyl compound such as benzyl, 1,7,7-trimethyl-bicyclo[2,2,1]heptane-2,3-dion, 9,10-penanthrenequinone or the like; a phosphine oxide compound such as 2,4,6-trimethylbenzoyl diphenylphosphine oxide, bis(2,6-dimethoxybenzoyl)-2,4,4-trimethylpentyl-phosphine oxide or the like; a benzoate compound such as methyl-4-(dimethylamino)benzoate, ethyl-4-(dimethylamino)benzoate, 2-n-buthoxyethyl-4-(dimethylamino)benzoate or the like; an amino synergist compound such as 2,5-bis(4-diethylaminobenzal)cyclopentanone, 2,6-bis(4-diethylaminobenzal)cyclohexanone, 2,6-bis(4-diethylaminobenzal)-4-methyl-cyclopentanone or the like; a coumarine compound such as 3,3-carbonylbis-7-(diethylamino)coumarine, 3-(2-benzothiazolyl)-7-(diethylamino)coumarine, 3-benzoyl-7-(diethylamino)coumarine, 3-benzoyl-7-methoxy-coumarine or 10,10-carbonyl-bis[1,1,7,7-tetramethyl-2,3,6,7-tetrahydro-1H,5H,11H-C1]-benzopyrano[6,7,8-ij]-quinolizine-11-on or the like; and a chalcone compound such as 4-diethylamino chalcone, 4-azidebenzalacetophenone or the like; 2-benzoylmethylene, 3-methyl-b-naphthothiazoline, or the like.

A representative example of the curing accelerators can include a heterocyclic aromatic amine compound, for which one can use at least one selected from the group consisting of a pyridine compound unsubstituted or substituted with a hydrocarbon group of C3 to C12; triazole; imidazole; quinoline; triazine; and the derivatives thereof.

Specifically, imidazole, benzoimidazole, 1-methyl-imidazole, 2-methyl-imidazole, ethyl imidazole, 1,2,4-triazole, 1,2,3-triazole, 2-mercaptobenzoxazole, 2,5-dimercapto-1,3,4-thiadiazole, 2-mercaptobenzoxazole, 2,5-dimercapto-1,3,4-thiadiazole, 2-mercapto-4,6-dimethylaminopyridine, 3-hydroxypyridine, 4-hydroxypyridine, 2,4-dimethylpyridine, 4-pyridinemethanol, nicotine aldehydeoxime, isonicotine aldehydeoxime, ethyl picolinate, ethyl isopicotinnate, 2,2'-bipyridyl, 4,4'-bipyridyl, 3-methylpyridazyle, quinoline, isoquinoline, phenanthridine, 2-mercaptobenzoimidazole, 2-mercaptobenzotriazole, phthalazine, 1,10-phenanthroline or the like can be used but the present invention is not limited thereto.

Flame Retardant

The photosensitive resin composition of the present invention may further include a flame retardant such as a phosphorous flame retardant. The phosphorous flame retardant has a compatibility with a solution composition comprising the polyamic acid, the photopolymerizable compound, and the like. In other words, the phosphorous flame retardant can impart a flame retardant property while being compatible with the photosensitive resin composition of the present invention. Such flame retardant can be included in the amount of 0.1 to 20 wt %, and more preferably 0.5 to 5 wt % in terms of the content ratio of the phosphorous atom with respect to a total weight of the solid contents of the photosensitive resin composition except for the polyamic acid. If the amount of the phosphorous flame retardant is less than 0.1wt %, it may be difficult to obtain a flame retardant effect. If the amount of the phosphorous flame retardant is more than 20 wt %, a developing property or mechanical properties of the film can deteriorate.

As the phosphorous flame retardant, one can use at least one of a compound including phosphorous and having (meth)acrylate in its structure, and a phosphorous compound prepared from an adduct of such compound with a compound having at least one epoxy or (meth)acrylate group in its molecule. Specifically, one can use 2-hydroxyethyl methacrylate phosphate (trade name: KAYAMER PM-2), 2-hydroxyethyl methacrylate caprolactone phosphate (trade name: KAYAMER PM-21), 10-(2,5-dihydroxyphenyl)-10H-9-oxa-10-phosphaphenanthrene-10-oxide (HCA-HQ), 9,10-dihydro-9-oxa-10-phosphaphenanthrene-10-oxide (HCA), or the like.

As the compound having (meth)acrylate in its molecule, a compound selected from the group consisting of 2-hydroxyethyl(meth)acrylate, benzyl(meth)acrylate, phenoxy-polyethylene(meth)acrylate, methoxypolypropyleneglycol (meth)acrylate, 2-hydroxypropyl(meth)acrylate, (meth)acryloyloxyethylhydrogenphthalate, 1,6-hexanediol di(meth)acrylate, ethanediol di(meth)acrylate, methylene bis (meth)acrylate, neopentylglycol di(meth)acrylate, 2-hydroxypropanediol di(meth)acrylate, isopropyldiol di(meth)acrylate and isopropyleneglycol di(meth)acrylate can be used alone or two or more compounds thereof can be used together.

Solvent

The photosensitive resin composition as described above can further include a solvent as a medium for each component as described above. For such solvent, one can use the one that can easily dissolve the polyamic acid, the photopolymerizable compound, the photoinitiator, the phosphorous flame retardant, or the like. It is preferable to use a solvent that can be easily evaporated in a coating process of the photosensitive resin composition. The content of the solvent preferably ranges from 300 to 700 parts by weight with respect to 100 parts by weight of the polyamic acid in the photosensitive resin composition.

In view of solubility, the solvent is preferably a nonprotonic polar organic solvent. Specifically, a solvent selected from the group consisting of N-methyl-2-pyrrolidone, N-acetyl-2-pyrrolidone, N-benzyl-2-pyrrolidone, N,N-dimethyl formamide, N,N-dimethyl acetamide, dimethyl sulfoxide, hexamethyl phosphortriamide, N-acetyl-$\epsilon$-caprolactam, dimethyl imidazolidinone, diethylene glycol dimethyl ether, triethylene glycol dimethyl ether, $\gamma$-butyrolactone, dioxane, dioxolan, tetrahydrofuran, chloroform and methylene chloride may be used alone or as a mixture of two or more of them.

Other Additives

In addition, the photosensitive resin composition as described above can further include an additive such as an antifoaming agent, a leveling agent, an anti-gelling agent, or the like in order to facilitate an application process or a curing process as necessary or to improve other properties. The specific types of such additives and the content thereof are obviously known in the art.

[Dry Films]

A dry film comprising the photosensitive resin composition as described above is provided in accordance with other embodiments of the present invention. Such dry film may be obtained by applying and drying the photosensitive resin composition on a support in a known method. Preferably, the support is such a type that the photosensitive resin composition layer applied thereon can be released off and also it has a good light transmittance. In addition, it is preferable that the surface of the support has a high degree of smoothness.

Examples of the support includes various types of plastic films such as polyethylene terephthalate, polyethylene naphthalate, polypropylene, polyethylene, cellulose triacetate, cellulose diacetate, poly(meth)acrylic acid alkyl ester, a poly (meth)acrylic acid ester copolymer, polyvinyl chloride, polyvinyl alcohol, polycarbonate, polystyrene, cellophane, a polyvinylidene chloride copolymer, polyamide, polyimide, a copolymer of vinyl chloride and vinyl acetate, polytetrafluoroethylene, polytrifluoroethylene, and the like. Also, a composite material made from two or more materials thereof can be used. Particularly preferable is a polyethylene terephthalate film that has an excellent light transmittance. The support has preferably a thickness of 5 to 150 µm and more preferably 10 to 50 µm.

A method of applying the photosensitive resin composition is not particularly limited, and one can use a method such as a spraying, a roll coating, a rotating coating, a slit coating, a compression coating, a curtain coating, a die coating, a wire bar coating, a knife coating or the like. A method of drying the photosensitive resin composition varies with the types of each component or the organic solvent and the content thereof, but the drying is preferably carried out at 60 to 100° C. for 30 seconds to 15 minutes.

A dry film, which is produced by applying the photosensitive resin composition of the present invention on a support and drying it, has a thickness of preferably 5 to 95 µm and more preferably 10 to 50 µm. The dry film would show a poor insulating property, if the thickness thereof is less than 5 µm. The film may have a poor resolution, if the thickness exceeds 95 µm.

As will be explained in more detail below, such a dry film can be developed with an alkaline aqueous solution after exposure to light to form a pattern without using a flammable organic solvent previously used in the art. For example, a pattern can be formed by a method comprising the steps of exposing the dry film to light; and developing it with an alkaline aqueous solution. As a result, the dry film of the present invention can reduce many of problems regarding a working stability or the environment in the photosensitive resin composition previously used.

In addition, after being obtained by curing the dry film as patterned, the film is superior in all the properties including a post-lamination filling property, a heat resistance, and the like. Also, since the dry film can be cured (or imidized) at a relatively low temperature, it can be preferably utilized in a use for forming a cover film of a printed circuit board or forming interlayer dielectrics in a laminated body for semiconductor.

[Printed Circuit Board]

In accordance with another embodiment of the present invention, a printed circuit board prepared by using the dry film of the present invention is provided. The printed circuit board can include a cured product of the dry film of the present invention.

By way of example for the printed circuit board, the dry film of the present invention is pre-laminated on the surface with a circuit formed thereon at a temperature of 25 to 50° C. in a method of a flat compression or a roll compression and then can be subjected to a vacuum lamination at a temperature of 60 to 90° C. to form a photosensitive film. The dry film can be patterned to form a fine hole or a fine width line by exposing it to light under a photomask. The amount of exposure to light varies with the type of a light source and the film thickness, but is preferably 100 to 1200 mJ/cm$^2$, and more preferably 100 to 400 mJ/cm$^2$. Although electronic beams, UV rays, and X-rays are available for active rays, UV rays are preferable. A high pressure mercury lamp, a low pressure mercury lamp, a halogen lamp and the like may be used as a light source.

After exposure to light, a developing process is generally carried out in an immersion method wherein the film is immersed in a developing solution. For the developing solution, an alkaline aqueous solution such as a sodium hydroxide aqueous solution or a sodium carbonate aqueous solution is used and the developing process with the alkali aqueous solution is followed by washing with water. After this, a heating treatment makes the polyamic acid be imidized into polyimide with the pattern obtained by the developing process and the temperature for heating is preferably to be the temperature required for the imidization ranging 150 to 230° C. More effectively, heating is continuously phased in over two to four steps with an appropriate temperature profile, but in some cases, curing at a constant temperature is also possible. Practicing the above processes can produce a printed circuit board such as a multilayered printed circuit board and the like.

[Flexible Circuit Board/Laminated Body for Semiconductor]

In accordance with yet another embodiment of the present invention, a flexible circuit board and a laminated body for a semiconductor prepared by using the dry film of the present invention are provided. The flexible circuit board and the laminated body for a semiconductor can include a cured product of the dry film of the present invention.

A method of applying the dry film of the present invention on the flexible circuit board and the laminated body for a semiconductor is the same as sufficiently described above for the printed circuit board, and except for that, the flexible circuit board or the laminated body for a semiconductor can be produced with a conventional method.

Accordingly, it is possible to obtain a circuit board or a semiconductor device wherein the dry film of the present invention is applied as protective films of the flexible circuit board or interlayer dielectrics for the layered body for a semiconductor.

ADVANTAGEOUS EFFECT OF THE INVENTION

In the present invention, in order to impart a photosensitivity, a photosensitive precursor of polyimide (i.e., the polyamic acid) is prepared by using a diamine compound with an acryloyl group having a novel structure, and a photosensitive resin composition including such precursor and various photopolymerizable compounds is prepared. The finally cured product obtained from this composition is superior in all the properties and can provide a photosensitive film or a laminated body that can properly protect the circuit and satisfy any requirements for all the properties such as a solder heat resistance after curing, a folding endurance (brittleness, a bending resistance), a chemical resistance, an electrically insulating property, a flame retardant property, and the like.

Also, the photosensitive resin composition of the present invention is developable with an alkaline aqueous solution and also the polyamic acid contained therein can be imidized at a relatively low temperature.

Therefore, the photosensitive resin composition of the present invention can be preferably utilized for various uses such as a cover film (a coverlay film) for different printed circuit boards, a circuit protection film for a flexible circuit board, and interlayer dielectrics for a laminated body for a semiconductor.

Mode For Practicing The Invention

Hereinafter, the functions and the effects of the present invention will be described in more detail with reference to specific examples of the present invention. However, the following examples are presented to be merely illustrative of the present invention, and they are not intended to limit the scope of the present invention.

SYNTHESIS EXAMPLE

Synthesis of
1,4-bis(4-aminobenzoyl)-2,5-bis(methacryloyl)ethyl benzoate

The above monomer (HEMA-DB) was synthesized through synthesis steps of Reaction Formula 1:

[Reaction Formula 1]

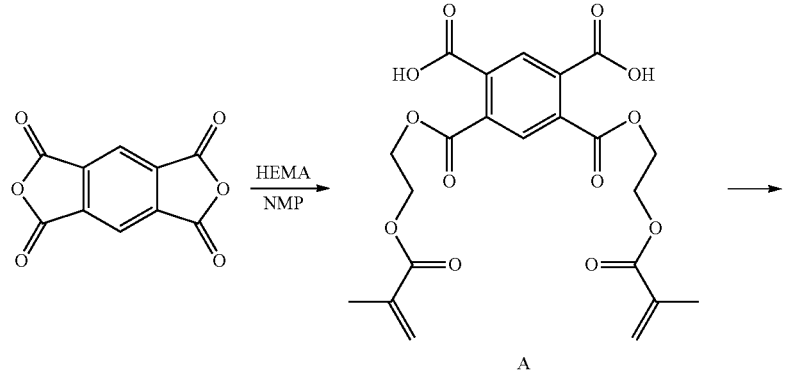

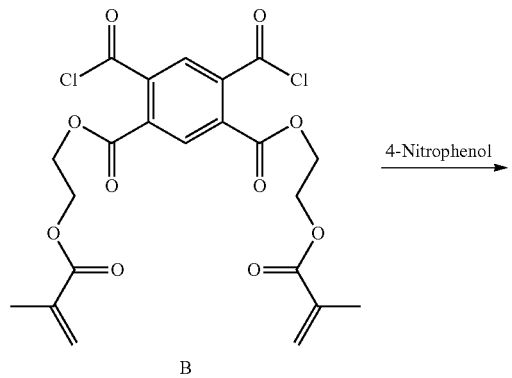

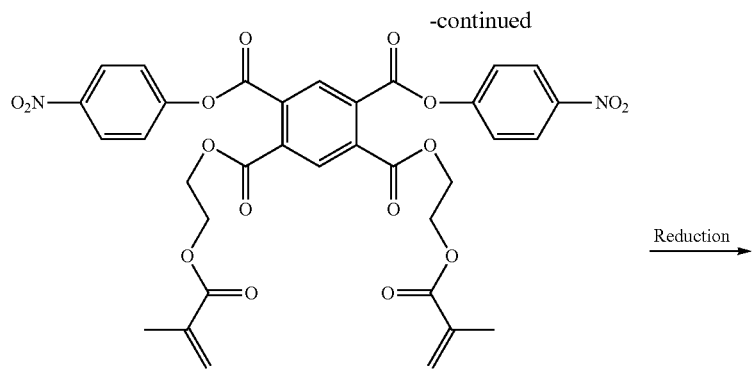

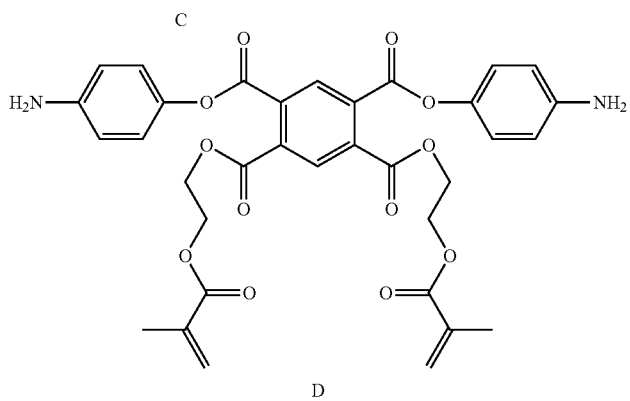

1. Synthesis of 1,4-dicarboxylic acid-2,5-bis(methacryloyl)ethyl benzoate (Chemical A)

In a 3-neck round bottom flask equipped with a stirrer, 100 g of pyromellitic dianhydride, 121 g of 2-hydroxyethyl methacrylate (HEMA), 162 g of pyridine, 250 g of N-methypyrrolidone (NMP), and 2 g of hydroquinone were placed and stirred homogeneously. This solution was stirred at 70° C. for 2 hours to proceed with the reaction. After completion of the reaction was confirmed, 800 g of ethylacetate was added as a solvent and then 10 g of a hydrochloric acid solution (10%) was added and stirred for 10 minutes. The resulting product was then washed with water to remove a salt and N-methypyrrolidone therefrom, and Chemical A (a product of step 1) was obtained through distillation under a reduced pressure.

2. Synthesis of 1,4-dicarboxylic acylchloride-2,5-bis(methacryloyl)ethyl benzoate (Chemical B)

100 g of Chemical A obtained from step 1 was diluted with 200 g of dimethyl chloride, provided with a cooling bath at 15° C. and then added dropwise with 100 g of phosphorous pentachloride over 1 hours. After completion of the reaction, the resulting solution was added dropwise to 300 g of hexane to remove an unreacted phosphorous pentachloride and was distilled under a reduced pressure to give Chemical B (a product of step 2).

3. Synthesis of 1,4-bis(4-nitrobenzoyl)-2.5-bis(methacryloyl)ethyl benzoate (Chemical C)

In a 3-neck round bottom flask equipped with a stirrer, 30 g of 4-nitrophenol, 100 g of methylene chloride, and 23 g of triethyl amine were placed and then provided with a cooling bath at 10° C. 51 g of Chemical B obtained from step 2 was diluted with 100 g of methylene chloride and then the resulting solution was added dropwise to the solution as prepared above over 10 minutes. After that, the mixture was further stirred at room temperature for one hour.

After completion of the reaction was confirmed, the resulting product was added with 10 g of a hydrochloric acid solution (5%) and stirred for 10 minutes. After that, Chemical C (a product of step 3) was obtained through a washing with water and a distillation under a reduced pressure.

4. Synthesis of 1,4-bis(4-aminobenzoyl)-2,5-bis(methacryloyl)ethyl benzoate (Chemical D)

In a 3-neck round bottom flask, 30 g of Chemical C obtained from step 3, 200 g of isopropyl alcohol, and 30 g of a distilled water were added and heated slowly to 50° C. Then, the mixture was added with 7 ml of hydrochloric acid and 30 g of an iron powder and reacted for 8 hours while the temperature of the reaction solution being maintained at 70° C. After completion of the reaction was confirmed, the iron powder was removed by a hot filtration and the resulting solution was distilled under a reduced pressure. The product obtained therefrom was dissolved in dichloromethan and then the remaining hydrochloric acid was eliminated therefrom by using a sodium hydroxide solution. A crude products was finally obtained through washing with water and distillation under a reduced pressure. Recrystallization of this product with hexane and isopropyl alcohol gave the final product.

PREPARATION EXAMPLE

Preparation of a Polyamic Acid

Preparation Example 1

In a 4-neck round bottom flask equipped with a thermometer, a stirrer, a nitrogen input port, and a powder dispensing funnel, 38 g of 4,4'-oxydiphthalic anhydride (ODPA) was dispersed in 490 g of a mixed solvent of toluene and dimethyl acetamide (weight ratio: 3:7) with nitrogen flowing therein. Then, the resulting mixture was added with 43 g of a diamine siloxane compound, X-22-9409 (manufactured by Shinetsu Co. Ltd.) over 15 minutes. After being stirred at room temperature for 40 minutes, the mixture was added with 19.35 g of 4,4'-oxydianiline (4,4'-ODA), 38 g of 1,3-bis(4-aminophenoxy)benzene (TPE-R), and 17.3 g of HEMA-DB synthesized in the above synthesis example and stirred to dissolve them completely. With cooling to a temperature of 15° C. or lower, the solution was slowly added with 54 g of 3,3'-4,4'-biphenyl tetracarboxylic dianhydride (BPDA) and stirred for 24 hours to give a polyamic acid varnish. The solid content of the varnish solution was 30wt % and the viscosity thereof was found to be 3,200 cps at room temperature.

Preparation Example 2

In a 4-neck round bottom flask equipped with a thermometer, a stirrer, a nitrogen input port, and a powder dispensing funnel, 27.7 g of 4,4'-oxydiphthalic anhydride (OPDA) was dispersed in 350 g of a mixed solvent of toluene and dimethyl acetamide (weight ratio: 3:7) with nitrogen flowing therein. Then, the resulting mixture was added with 31.1 g of a diamine siloxane compound, X-22-9409 (manufactured by Shinetsu Co. Ltd.) over 15 minutes. After being stirred at room temperature for 40 minutes, the mixture was added with 18.33 g of 4,4'-oxydianiline (4,4'-ODA) and 33.5 g of 1,3-bis(4-aminophenoxy)benzene (TPE-R), and stirred to dissolve them completely. With cooling to a temperature of 15° C. or lower, the solution was slowly added with 39.33 g of 3,3'-4, 4'-biphenyl tetracarboxylic dianhydride (BPDA) and stirred for 24 hours to give a polyamic acid in the form of varnish. The solid content of the varnish solution was 30wt % and the viscosity thereof was found to be 3,200 cps at room temperature.

Preparation Example 3

In a 4-neck round bottom flask equipped with a thermometer, a stirrer, a nitrogen input port, and a powder dispensing funnel, 91.8 g of 4,4'-oxydiphthalic anhydride (ODPA) was dispersed in 490 g of a mixed solvent of toluene and dimethyl acetamide (weight ratio: 3:7) with nitrogen flowing therein. Then, the resulting mixture was added with 42.45 g of a diamine siloxane compound, X-22-9409 (manufactured by Shinetsu Co. Ltd.) over 15 minutes. After being stirred at room temperature for 40 minutes, the mixture was added with 18.7 g of 4,4'-oxydianiline (4,4'-ODA), 36.5 g of 1,3-bis(4-aminophenoxy)benzene (TPE-R), and 20.5 g of HEMA-DB synthesized in the above synthesis example and stirred to dissolve them completely. With cooling to a temperature of 15° C. or lower, the solution was stirred for 24 hours to give a polyamic acid varnish. The solid content of the varnish solution was 30wt % and the viscosity thereof was found to be 3,200 cps at room temperature.

Preparation Example 4

In a 4-neck round bottom flask equipped with a thermometer, a stirrer, a nitrogen input port, and a powder dispensing funnel, 31.6 g of 4,4'-oxydiphthalic anhydride (ODPA) was dispersed in 275 g of dimethyl formamide with nitrogen flowing therein. Then, the mixture was added with 22 g of a diamine siloxane compound, X-22-9409 (manufactured by Shinetsu Co. Ltd.) over 15 minutes. After being stirred at room temperature for 40 minutes, the mixture was added with 42.6 g of 1,3-bis(3-aminophenoxy)benzene (APB-N), and 10.7 g of HEMA-DB synthesized in the above synthesis example and stirred to dissolve them completely. With cooling to a temperature of 15° C. or lower, the solution was slowly added with 9.5 g of pyromellitic dianhydride (PMDA) and stirred for 24 hours to give a polyamic acid varnish. The solid content of the varnish solution was 30wt % and the viscosity thereof was found to be 3,400 cps at room temperature.

Example 1 to Example 9

Preparation of Photosensitive Resin Composition

With respect to 100 part by weight of the polyamic acid varnish obtained from the methods of Preparation Examples 1, 3, and 4, each component shown in Tables 1 and 2 was mixed based on the mixing ratio of the solid component (parts by weight) to give a photosensitive resin composition.

Comparative Example 1

With respect to 100 part by weight of the polyamic acid varnish obtained from the methods of Preparation Example 2, each component shown in Table 1 was mixed based on the mixing ratio of the solid component (parts by weight) to give a photosensitive resin composition.

TABLE 1

| Polyamic acid | Example 1<br>Prep. Example 1 | Example 2<br>Prep. Example 1 | Example 3<br>Prep. Example 1 | Example 4<br>Prep. Example 1 | Example 5<br>Prep. Example 1 | Comparative Example 1<br>Prep. Example 2 |
|---|---|---|---|---|---|---|
| PAA(30 wt %) | 100 | 100 | 100 | 100 | 81.32 | 81.32 |
| BPE-900 | 20 | 20 | 20 | 20 | 16 | 16 |
| EA-1020 | 15 | 13 | 13 | 13 | 13 | 13 |
| DPEA-12 | 2 | 4 | — | — | 4 | 4 |
| GPO-303 | — | — | 4 | — | — | — |
| P-2M | — | — | — | 4 | — | — |
| RM-1001 | — | — | — | — | 4 | 4 |
| 1651 | 0.88 | 0.88 | 0.88 | 0.88 | 0.88 | 0.88 |
| 1819 | 0.59 | 0.59 | 0.59 | 0.59 | 0.59 | 0.59 |
| 1,2,4-Triazole | 1.83 | 1.83 | 1.83 | 1.83 | 1.83 | 1.83 |

In Table 1, PAA (PolyAmic Acid) is a polyamic acid with the solid content of 30 wt %, BPE-900 is an ethoxylated bisphenol A methacrylate compound (manufactured by Shinnakamura Chemicals Co. Ltd., EO=17) as a photopolymerizable component, EA-1020 is an epoxy (meth)acrylate including at least two hydroxyl groups (manufactured by Shinnakamura Chemicals co. ltd.) as a photopolymerizable compound, DPEA-12 is an EO modified dipentaerytritol hexaacrylate (manufactured by Shinnakamura Chemicals Co., Ltd.) as a photopolymerizable compound, GPO-303 is a propoxylated glycerine triacrylate (manufactured by Shinnakamura Chemicals Co. Ltd., n=3) as a photopolymerizable compound, P-2M is a phospate of 2-hydroxyethylmethacrylate (manufactured by Nipponkayaku Co. Ltd.), RM-1001 is acryloyl morpholine (manufactured by Nipponkayaku Co.

Ltd.), 1651 and 1819 is Irgacure 651 and Irgacure 819 respectively, which are a photoinitiator, and 1,2,4-triazole is a product of Aldrich Co. Ltd.

TABLE 2

|  | Example 6 Prep. Example 1 | Example 7 Prep. Example 1 | Example 8 Prep. Example 3 | Example 9 Prep. Example 4 |
|---|---|---|---|---|
| Polyamic acid |  |  |  |  |
| PAA(30 wt %) | 100 | 100 | 100 | 100 |
| BPE-900 | 0.45 | 0.45 | 0.45 | 0.45 |
| A-9300 | — | 0.1 | 0.1 | 0.1 |
| RM-1001 | — | 0.1 | 0.1 | 0.1 |
| EA-1020 | 0.2 | — | 0.35 | 0.35 |
| EA-6320 | — | 0.35 | — | — |
| ZFA-266H | 0.25 | — | — | — |
| R-115 | 0.1 | — | — | — |
| ITX | — | 0.005 | 0.005 | 0.005 |
| I651 | 0.02 | 0.02 | 0.02 | 0.02 |
| TPO | 0.03 | 0.03 | 0.03 | 0.03 |
| 1,2,4-triazole | 0.05 | 0.05 | 0.05 | 0.05 |

In Table 2, A-9300 is tris(2-hydroxyethyl)isocyanurate (manufactured by Shinnakamura Co. Ltd.), EA-6320 is a phenol novolac modified epoxy acrylate (manufactured by Shinnakamura Co. Ltd.), R-115 is a bisphenol A oligomer diacrylate (manufactured by Nippon Kayarad Co., Ltd.), ZFA-266H is a bisphenol F novolac modified epoxy acrylate (manufactured by Nippon Kayarad Co., Ltd.), and ITX is isopropylthioxanthone which is a photosensitizer.

TEST EXAMPLE

Production of Test Sample

A solution of each photosensitive resin composition as obtained were uniformly applied onto a polyethylene terephthalate film (manufactured by Teijin Dupont Co. Ltd.) having a thickness of 25 μm used as a support film. Then, the applied film was dried by using a hot air convection dryer at 75° C. to form a photosensitive resin composition layer with a thickness of 31 μm after drying. On this photosensitive resin composition layer, a polyethylene protective film (manufactured by Tamapoly Co., Ltd., trade name: NF-15) was laminated by a roll compression to obtain a photosensitive element (a dry film) for each of the examples and the comparative example.

After a removal of the protective film therefrom, the dry film is placed on the surface of the copper clad of a patterned 2CCL, subjected to a vacuum lamination at 70° C. for 30 seconds, cured in the oven under nitrogen atmosphere at 180° C. for 2 hours, and then evaluated. For each film as produced in the examples and the comparative example, properties were determined in accordance with the evaluation methods as follows.

1. Post-lamination Filling Property

After the vacuum lamination was carried out at a temperature of 70° C. under a pressure of 0.7 MPa for a compression time of 40 seconds and a vacuum time of 20 seconds, the filling property of the film was evaluated.

2. Developing Property

After the produced dry film was subjected to a vacuum lamination on a copper clad, exposed to light at 350 mJ/cm², and then developed by spraying a sodium carbonate aqueous solution (1 wt %) at 30° C., it was determined whether the film can be developed to have a pitch of L/S=50 μm/50 μm.

3. Adhesion Strength (Cross-cut Method)

After the finally cured film of the photosensitive resin composition was obtained on the surface of the copper clad of a 2CCL product through a series of processes, its adhesion strength was evaluated with a cross-cut tape method in accordance with JIS K5400.

4. Adhesion Strength

After the finally cured film of the photosensitive resin composition was obtained on the surface of the copper clad through a series of processes, its adhesion property was determined with a peel in accordance with JIS K5404.

5. Curl (2CCL) (a Degree of Bending)

After the finally cured film of the photosensitive resin composition was obtained on the surface of the copper clad of a 2CCL product through a series of processes, it was cut in size of 200 mm×200 mm and was made stand vertically to determine the radius of curvature for the film.

6. Hot Moisture Resistance (PCT Resistant Property)

After the finally cured film of the photosensitive resin composition was obtained on the surface of the copper clad of a 2CCL product through a series of processes, it was placed under a high temperature of 120° C. and a high humidity of 100% RH for 5 hours before it was observed whether a color change or a interface expansion occurs on the cured film.

7. Solder Heat Resistance

After the dry film was floated in a solder bath with a temperature of 288±5° C. for 1 minute with the surface of the film facing upward, it was visually inspected whether any abnormalities occur in the dry film.

8. Bending Property

After the dry film was subjected to a vacuum lamination on a FCCL pattern with L/S=100 μm/100 μm, exposed to light, developed, and then cured, its bending property was determined in accordance with a MIT method (0.38R, 500 g load) (JIS C6471)

9. Chemical Resistant Property

After the film was immersed in a $H_2SO_4$ solution (10 (v/v) %), a NaOH solution (10 (v/v) %), and Isopropyl alcohol (IPA) for 10 minutes, it was determined whether a peeling, a color change or the like occur in the film.

10. Coefficient of Thermal Expansion (CTE)

After the finally cured film of the photosensitive resin composition was obtained on the surface of the copper clad through a series of processes, it was cut into a film with a width of 5 mm and separated from the copper clad. For the cured film thus obtained, a degree of expansion of the film depending on the temperature was determined by using a thermal mechanical analysis (TMA).

The evaluation results for the films from the examples and the comparative example are summarized in Table 3 and Table 4 as follows.

TABLE 3

|  | Example 1 | Example 2 | Example 3 | Example 4 | Example 5 | Comp. Example 1 |
|---|---|---|---|---|---|---|
| Thickness (final, μm) | 28 | 28.3 | 28.7 | 27 | 27 | 27 |
| Post lamination filling property | good | good | good | good | good | good |
| Developing (29° C.) | 60 s | 65 s | 60 s | 60 s | 60 s | 60 s |
| Cross-cut (Cu) | 90/100 | 100/100 | 100/100 | 95/100 | 95/100 | 50/100 |
| peel | 193 | 214 | 307 | 235 | 225 | 150 |
| MIT | 389 | 362 | 323 | 325 | 395 | 280 |
| Curl (2CCL) | 100 | 20 | 15 | ∞ | ∞ | ∞ |
| Solder Solder (on a heat | OK | OK | OK | OK | OK | NG |

TABLE 3-continued

| | | Example 1 | Example 2 | Example 3 | Example 4 | Example 5 | Comp. Example 1 |
|---|---|---|---|---|---|---|---|
| 2CCL) | resistant PCT | OK | OK | OK | Dela. Water mark | OK | Dela. Water mark |
| Mechanical Properties | Elongation (%) | 30.2 | 33 | 35.6 | 27.9 | 31.6 | 23 |
| | T-strength (MPa) | 22 | 22 | 26 | 20 | 20 | 13 |
| | E-modulus (MPa) | 585 | 702 | 524 | 483 | 468 | 440 |
| Chemical Resistance | IPA | OK | OK | OK | OK | OK | OK |
| | $H_2SO_4$ | OK | OK | OK | OK | OK | — |
| | NaOH | OK | OK | OK | OK | OK | Film distortion at a edge of the test sample |

TABLE 4

| | | Example 6 | Example 7 | Example 8 | Example 9 |
|---|---|---|---|---|---|
| Thickness (final, μm) | | 38 | 37 | 37 | 37 |
| Lamination Temp. (° C.) | | 70 | 70 | 70 | 70 |
| (0.7 MPa, 20/40) | Filling property | good | good | good | good |
| Developing (31° C.) | | 60 s | 60 s | 60 s | 60 s |
| Cross cut (Cu) | | 100/100 | 100/100 | 100/100 | 100/100 |
| Peel | | 230 | 250 | 210 | 205 |
| MIT | | 342 | 295 | 320 | 320 |
| Curl (2CCL) | | 9 | 15 | 9 | 13 |
| Solder (on a 2CCL) | Solder heat resistance PCT | OK OK, Smooth | OK OK, Smooth | OK OK, Smooth | OK OK, Smooth |
| Thermal properties | Tg (° C.) | 181 | 150 | 182 | 170 |
| | CTE | 80 | 120 | 99 | 99 |
| Elongation (%) | | 31 | 26 | 34 | 27 |

Referring to Tables 3 and 4, it was found that the films of the examples have an excellent post-lamination filling property, and are superior in a heat resistance, a moisture resistance, mechanical properties, a chemical resistance and the like, so that it can be preferably utilized as a use of a cover film of a printed circuit board. It was also found that the above films can be obtained through a developing process with an alkaline aqueous solution for the photosensitive resin composition of the examples, and as shown by the test examples, the films have excellent properties in Tables 3 and 4 even when they are obtained by an imidization at a relatively low temperature (about 180° C.).

By comparison, it was found that the film of Comparative Example 1 is inferior in the properties such as the adhesion to the support, the hot moisture resistant property, the mechanical properties, and the like so that it is not suitable for a use of a cover film of a printed circuit board.

The invention claimed is:

1. A photosensitive resin composition comprising:
(A) a polyamic acid comprising a polymer of at least one diamine compound comprising a compound of Chemical Formula (1) as follows and at least one acid dianhydride;
(B) a photopolymerizable compound having at least one polymerizable ethylenic unsaturated bond in its molecule; and
(C) a photoinitiator:

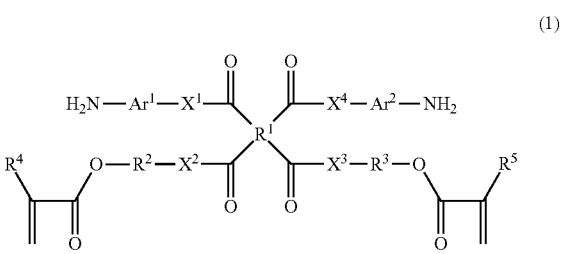

(1)

in Chemical Formula (1), each of $X^1$ to $X^4$ is independently —O— or NR', in which each R' is independently hydrogen or an alkyl group of C1 to C3;

$R^1$ is a tetravalent cycloaliphatic hydrocarbon group of C5 to C18 or a tetravalent aromatic hydrocarbon group of C6 to C18;

each of $R^2$ and $R^3$ is independently an alkylene group of C1 to C6;

each of $R^4$ and $R^5$ is independently hydrogen or an alkyl group of C1 to C6; and each of $Ar^1$ and $Ar^2$ is independently an arylene group of C6 to C18.

2. The photosensitive resin composition according to claim 1, wherein in the compound of Chemical Formula (1), each of $X^1$ to $X^4$ is —O—; $R^1$ is a tetravalent aromatic hydrocarbon group of C6 to C10; each of $R^2$ and $R^3$ is independently an alkylene group of C1 to C3; each of $R^4$ and $R^5$ is independently hydrogen or an alkyl group of C1 to C3; each of $Ar^1$ and $Ar^2$ is independently an arylene group of C6 to C10.

3. The photosensitive resin composition according to claim 2, wherein the compound of Chemical Formula (1) is a compound of Chemical Formula (2) as follows:

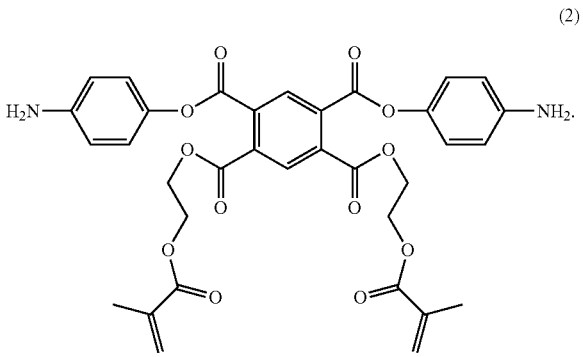 [SMILES: C=C(C)C(=O)OCCOC(=O)c1cc(C(=O)OCCOC(=O)C(=C)C)c(C(=O)Oc2ccc(N)cc2)cc1C(=O)Oc1ccc(N)cc1]

(2)

4. The photosensitive resin composition according to claim 1, wherein it further comprises at least one additive selected from the group consisting of a photocrosslinking sensitizer, a curing accelerator, a flame retardant, an antifoaming agent, a leveling agent, and an anti-gelling agent.

5. The photosensitive resin composition according to claim 1, wherein it further comprises a silicon diamine compound of Chemical Formula (3) as follows:

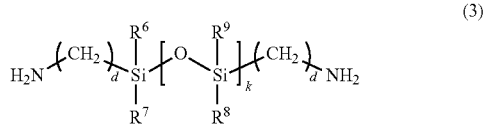
(3)

in Chemical Formula (3), each of $R^6$ to $R^9$ is independently an aliphatic hydrocarbon group of C1 to C12, a phenyl group, or a methoxy group;
d is an integer of 1 to 5; and,
k is an integer of 1 to 20.

6. The photosensitive resin composition according to claim 1, wherein the diamine compound further comprises at least one compound selected from the group consisting of p-phenylenediamine, m-phenylenediamine, 4,4'-oxydianiline, 3,4'- oxydianiline, 2,2-bis(4-[4-aminophenoxy]-phenyl)propane, 1,3-bis(4-aminophenoxy)benzene, 1,4-bis(4-aminophenoxy)benzene, and 2,2-bis(4-[3-aminophenoxy]phenyl) sulfone.

7. The photosensitive resin composition according to claim 1, wherein the acid dianhydride further comprises at least one compound selected from the group consisting of pyromellitic dianhydride, 3,3'-4,4'-biphenyltetracarboxylic dianhydride, 3,3',4,4'-benzophenone tetracarboxylic dianhydride, 4,4'-oxydiphthalic anhydride, 4,4'- (4,4'-isopropylbiphenoxy) biphthalic anhydride, 2,2'-bis-(3,4- dicarboxylphenyl) hexafluoropropane dianhydride, and ethylene glycol bisanhydrotrimellitate.

8. The photosensitive resin composition according to claim 1, wherein a mole ratio of the diamine compound : the acid dianhydride is between 1:0.9 and 1:1.1.

9. The photosensitive resin composition according to claim 1, wherein an weight average molecular weight of the polyamic acid is from 5,000 to 300,000.

10. The photosensitive resin composition according to claim 1, wherein the photopolymerizable compound comprises a (meth)acrylate compound either having two photopolymerizable double bonds or having both at least one double bond and at least one hydroxyl or epoxy group.

11. The photosensitive resin composition according to claim 1, wherein the photopolymerizable compound is included in the amount of 30 to 200 parts by weight with respect to 100 parts by weight of the polyamic acid.

12. The photosensitive resin composition according to claim 1, wherein the photoinitiator is included in the amount of 0.3 to 10 parts by weight with respect to 100 parts by weight of the polyamic acid.

13. The photosensitive resin composition according to claim 4, wherein each of the photocrosslinking sensitizer and the curing accelerator is included in the amount of 0.01 to 10 parts by weight with respect to 100 parts by weight of the polyamic acid.

14. The photosensitive resin composition according to claim 4, wherein the flame retardant comprises at least one compound selected from the group consisting of 2-hydroxyethyl methacrylate phosphate, 2-hydroxyethyl methacrylate caprolactone phosphate, 10-(2,5-dihydroxyphenyl)-10H-9-oxa-10-phosphaphenanthrene-10-oxide, and 9,10-dihydro-9-oxa-10-phosphaphenanthrene-10-oxide.

15. The photosensitive resin composition according to claim 4, wherein the flame retardant is included in the amount of 0.1 to 20 wt % with respect to a total weight of the solid contents except for the polyamic acid.

16. The photosensitive resin composition according to claim 1, wherein it further comprises at least one solvent selected from the group consisting of N-methyl-2-pyrrolidone, N-acetyl-2-pyrrolidone, N-benzyl-2-pyrrolidone, N,N-dimethyl formamide, N,N-dimethyl acetamide, dimethyl sulfoxide, hexamethyl phosphortriamide, N-acetyl-ϵ-caprolactam, dimethyl imidazolidinone, diethylene glycol dimethyl ether, triethylene glycol dimethyl ether, y-butyrolactone, dioxane, dioxolan, tetrahydrofuran, chloroform and methylene chloride.

17. The photosensitive resin composition according to claim 16, wherein the solvent is included in the amount of 300 to 700 parts by weight with respect to 100 parts by weight of the polyamic acid.

18. A dry film comprising a photosensitive resin composition of claim 1.

19. The dry film according to claim 18, wherein it is used for forming a cover film of a printed circuit board.

20. A method of forming a pattern which comprises the steps of: exposing a dry film of claim 18 to light; and developing the dry film in an alkaline aqueous solution.

21. A printed circuit board comprising a cured product of a dry film of claim 18.

22. A flexible circuit board comprising a cured product of a dry film of claim 18.

23. A laminated body for a semiconductor comprising a cured product of a dry film of claim 18.

* * * * *